United States Patent [19]

Iacovangelo et al.

[11] Patent Number: 5,500,248
[45] Date of Patent: *Mar. 19, 1996

[54] FABRICATION OF AIR BRAZABLE DIAMOND TOOL

[75] Inventors: Charles D. Iacovangelo, Schenectady; Elihu C. Jerabek, Glenmont, both of N.Y.

[73] Assignee: General Electric Company, Worthington, Ohio

[*] Notice: The portion of the term of this patent shall not extend beyond the expiration date of Pat. No. 5,346,719.

[21] Appl. No.: 286,076

[22] Filed: Aug. 4, 1994

[51] Int. Cl.$^6$ .............................. C23C 16/00; B05D 3/02
[52] U.S. Cl. .................. 427/250; 427/249; 427/383.1; 427/399; 427/405; 51/307; 51/309
[58] Field of Search ..................... 427/249, 248.1, 427/255.7, 250, 405, 383.1, 399; 51/307, 309; 407/119

[56] References Cited

U.S. PATENT DOCUMENTS

| | | |
|---|---|---|
| 3,650,714 | 3/1972 | Farkas . |
| 3,929,432 | 12/1975 | Caveney .................................. 51/295 |
| 4,605,343 | 8/1986 | Hibbs, Jr. et al. . |
| 4,649,992 | 3/1987 | Geen et al. . |
| 4,661,180 | 4/1987 | Frushour . |
| 4,767,050 | 8/1988 | Flood et al. . |
| 4,776,862 | 10/1988 | Wiand . |
| 4,784,023 | 11/1988 | Dennis . |
| 4,899,922 | 2/1990 | Slutz et al. . |
| 4,931,363 | 6/1990 | Slutz et al. . |
| 5,024,680 | 6/1991 | Chen et al. ............................... 51/295 |
| 5,037,704 | 8/1991 | Nakai et al. . |
| 5,173,089 | 12/1992 | Tanabe et al. . |
| 5,346,719 | 9/1994 | Zarnoch et al. .......................... 427/97 |

FOREIGN PATENT DOCUMENTS

| | | |
|---|---|---|
| 0402671 | 12/1990 | European Pat. Off. . |
| 0541071A1 | 12/1993 | European Pat. Off. . |
| 4-201004 | 7/1992 | Japan . |
| 2091763 | 8/1982 | United Kingdom . |

*Primary Examiner*—Roy V. King

[57] ABSTRACT

A diamond article, for example, a sheet-form diamond tool insert brazable in air. The diamond sheet has a dual layer coating, a WTi bonding layer and a protective braze compatible overcoat, such as a Ag overcoat. The interface between the WTi layer and the diamond substrate includes sufficient metal carbide component to provide adhesion. Once coated with the WTi layer and the protective overcoat, the dual-coated diamond insert may be air brazed to a tool substrate in a manufacturing environment using a standard braze without a vacuum furnace or special atmosphere. A method for manufacturing the diamond insert is also disclosed. The diamond insert is coated and heat treated in an oxygen- and nitrogen-free atmosphere to create metal carbide at the diamond-coating interface.

6 Claims, No Drawings

FABRICATION OF AIR BRAZABLE DIAMOND TOOL

CROSS-REFERENCE TO RELATED APPLICATIONS

The present application contains subject matter related to U.S. application Ser. No. 08/310,440, filed Sep. 22, 1994, commonly assigned and filed concurrently herewith.

BACKGROUND OF THE INVENTION

The present invention relates to brazable articles, and more particularly to a brazable in air diamond tool insert fabricated from a diamond substrate having a bond coat deposited thereon.

The use of diamond tools in the superabrasives market is widespread. Diamond inserts can be fabricated from natural monocrystalline diamond, sintered polycrystalline diamond (PCD) blanks often referred to as compacts, or thermally stable diamond (TSD). More recently, polycrystalline diamond sheets prepared by CVD have been used as diamond tool inserts.

Diamond is often bonded to tungsten carbide tools to improve the performance of the tool. The greatest impediment to the use of diamond in tools is the difficulty of achieving adequate bond between the diamond and the cemented tungsten carbide tool base used to give strength to the tool. Thermal oxidation of diamond above about 700° C. is the chief limiting factor to the achievement of an adequate bond. Typically, bonding is carried out at temperatures of 1000°–1200° C. in a controlled vacuum using braze alloys that contain transition metals to give adhesion to the diamond. Careful control of the oxygen partial pressure is required to prevent oxidation of the diamond and the transition metals.

While this high temperature brazing process gives satisfactory results, it is difficult to manage in production, uses expensive and often brittle brazes, and requires expensive equipment not usually found in the manufacturing environment in which the tools are used. There is a great need in the industry, therefore, for a diamond tool insert that can be brazed in air with standard low temperature brazes. To enable the brazing of diamond in air a coating material is needed that will bond to diamond and make a good metallurgical bond to the braze in an oxygen containing environment.

The prior art is deficient in satisfactory techniques for brazing diamond, especially CVD diamond, to tools. Prior art approaches taken to bonding of diamond to tools generally fall into three categories: geometric effects, coatings or intermediate layers, and brazes. For example, U.S. Pat. No. 4,931,363 discloses the use of high temperature brazes containing chromium for improved bonding of diamond compacts to tungsten carbide tools. European Patent Application, Publication No. 0 402 671 discloses the use of high temperature carbide forming brazes to bond CVD diamond. Each of these, however, require high temperature brazes that must be bonded in controlled vacuum environments.

In U.S. Pat. Nos. 4,649,992, 4,661,180, 4,767,050, and 4,784,023, various geometric approaches to improving adhesion are presented, for example, frustoconical shapes, interlocking alternating ridges, and pocketed substrates. These approaches, however, still require expensive high temperature brazes and vacuum processing.

The use of coatings and interlayers is also disclosed in the prior art. For example, U.S. Pat. No. 4,776,862 discloses the use of carbide forming transition metals as coatings on powders that are then brazed. U.S. Pat. No. 5,037,704 discloses the use of transition metal carbide formers as coatings on compacts prior to protective brazing. United Kingdom Patent Application, Publication No. GB 2 091 763 discloses the use of carbide forming transition metals as additives to abrasive powders during high pressure and temperature sintering. Finally, Japanese Kokai Patent Application No. HEI 4[1992]-21004 discloses the use of a thick transition metal layer, typically 1–5 mm, between diamond and tool substrates prior to brazing in vacuum, typically at 1100° C. While these references disclose the use of transition metals to improve adhesion to diamond, they do not address the issue of brazing in air.

As mentioned above, the greatest impediment to the use of diamond in tools is the difficulty of achieving adequate bond between the diamond and the cemented tungsten carbide tool base which is used to give strength to the tool. Thermal oxidation of diamond above about 700° C. is the chief limiting factor to the achievement of an adequate bond. It would be desirable, particularly for on site replacement of worn diamond tool inserts, to have a diamond insert brazable in an air environment using a standard low temperature braze alloy.

It is an object of the present invention to provide a diamond article which may be directly brazed to a tool body in air.

It is another object of the present invention provide a diamond article which may be strongly bonded to a tool body with low temperature braze.

It is another object to alter the surface of a diamond article so that a strong brazed joint may be easily formed at the work location.

Other and additional objects will become apparent from the description of the invention as set forth herein.

SUMMARY OF THE INVENTION

In accordance with the present invention, there is provided a diamond article for brazing to a substrate comprising a diamond substrate; a tungsten and titanium metal layer bonded directly to said diamond substrate through an interface comprising titanium carbide to provide adhesion of said metal layer to said diamond substrate; a substantially non-oxidizable protective layer comprising a braze compatible material disposed on and adhered to said metal bonding layer.

According to another aspect of the present invention, the diamond article is brazed to a body, such as tool body, through a braze and a compatible substantially non-oxidizable protective layer.

According to another aspect of the present invention, a diamond article is prepared by depositing a tungsten and titanium metal layer on a diamond substrate; depositing a substantially non-oxidizable protective layer on the metal layer to form a dual-coated diamond article; and heating the metal layer at a temperature and for a time sufficient to form titanium carbide at the interface between the metal layer and the diamond substrate to provide adhesion of the metal bonding layer to the diamond substrate.

For a better understanding of the present invention, together with other objects, advantages, and capabilities thereof, reference is made to the following Description and appended claims.

DETAILED DESCRIPTION OF THE PREFERRED EMBODIMENTS

The article of the present invention includes a diamond substrate, a tungsten-titanium metal layer bonded to the diamond substrate, and a protective layer disposed over the tungsten-titanium bonding layer to present a barrier against oxidizing the tungsten-titanium layer. The diamond substrate is preferably a chemically vapor deposited (CVD) diamond. Such diamond substrates may be typically cut from a CVD diamond layer which has been separated from a growth substrate. This layer may be thinned to a preferred thickness. The major opposing surfaces of the substrate may be planarized and/or thinned to the desired surface finish by mechanical abrasion or by other means such as laser polishing, ion thinning, or other chemical methods. Preferably, conductive CVD diamond layers can be cut by electro-discharge machining, while insulating films can be cut with a laser to form discs, squares, or other symmetrical shapes.

Typical CVD diamond substrates include spaced apart parallel flat surfaces. One technique for making diamond substrates is set forth in U.S. Pat. No. 5,110,579 to Anthony et al. According to the processes set forth in the patent, diamond is grown by chemical vapor deposition on a substrate such as molybdenum by a filament process. According to this process, an appropriate mixture such as set forth in the example is passed over a filament for an appropriate length of time to build up the substrate to a desired thickness and create a diamond film. As set forth in the patent, a preferred film is substantially transparent columns of diamond crystals having a <110> orientation perpendicular to the base. Grain boundaries between adjacent diamond crystals having hydrogen atoms saturating dangling carbon bonds is preferred wherein at least 50 percent of the carbon atoms are believed to be tetrahedral bonded based on Raman spectroscopy, infrared and X-ray analysis.

Such a diamond sheet may be fabricated by the CVD process disclosed in commonly assigned U.S. patent applications Ser. No. 07/366,823, filed Jun. 15, 1989 now abandoned and U.S. Pat. No. 4,958,592 entitled Resistance Heater for Diamond Production by CVD, Ser. No. 07/234,773, filed Aug. 22, 1988, both incorporated herein by reference. In this process, a diamond layer is grown on a surface by a low pressure CVD process, then the diamond layer is removed from the surface, forming the diamond sheet. Alternatively, any suitable CVD or other method for making a diamond sheet may be used. If desired, the diamond sheet may be mechanically or chemically processed to preselected dimensions before coating.

The diamond film typically has one surface corresponding to an initial growth surface. This initial growth surface corresponds to the surface that was adjacent to a support substrate, such a molybdenum, upon which diamond is initially nucleated. This surface typically has a very fine diamond grain structure. As the film grows and as the growth is discontinued when the desired thickness is obtained, an opposing or top surface is formed which may typically have a larger diamond crystal structure. The present invention is particularly suited for use with diamond that is grown under very pure process conditions and may be applied to either surface. It is contemplated that CVD diamond having such preferred properties and structure may be produced by a variety of other techniques such as microwave CVD and DC jet CVD. It has been discovered that as the quality of the CVD diamond improves, i.e. less surface imperfections and less impurities, it becomes increasing difficult to obtain a good bond between the diamond substrate and a tool body.

In accordance with the principles of the present invention, a tungsten and titanium metal containing layer is deposited directly on the diamond substrate. This deposition may be performed by known method, e.g., by CVD or by a physical vapor deposition (PVD) method such as sputtering. Preferably the tungsten and titanium is deposited as an alloy, but it is contemplated that the deposition may include thin layers. The tungsten and titanium metal containing layer preferably consist entirely of tungsten and titanium metal. The tungsten and titanium of the alloy can be prealloyed, or the alloy can be formed during the deposition process.

The titanium component of the bonding layer alloy should be present in an amount sufficient to provide a good bond to the diamond substrate. The tungsten component of the alloy controls and reduces the activity of the titanium. Preferably the tungsten and titanium metal layer comprises from about 1 to about 50 percent by weight titanium with the balance being tungsten, more preferably from about 10 to about 30 percent by weight titanium with the balance being tungsten, and most preferably the tungsten and titanium is present in a ratio of tungsten to titanium of about 90:10 by weight. A metal coat of a tungsten-titanium alloy is preferably at least about 0.05 μm thick.

Next the titanium and tungsten metal coated diamond, is heated at a temperature and for a time sufficient to create the metal carbides of titanium and tungsten, at an interface between the diamond substrate and the titanium and tungsten metal layer. The heat treatment results in the formation of sufficient metal carbides at the interface between the metal bonding layer and the diamond substrate to provide the desired adhesion of the metal bonding layer to the diamond substrate. Desirably the degree of adhesion is greater than 20 Kpsi in shear, i.e. Instron shear test. The heating step may be performed either after deposition, as in the case of sputtered deposits, during deposition, as in the case of high temperature CVD processes, or at later stages of processing a completed tool.

The heating step is preferably carried out in an inert atmosphere or vacuum. An oxygen and nitrogen-free atmosphere desirably minimizes reactions which might result in the formation of oxides and nitrides of titanium and tungsten. The time and temperature of heating is sufficient to create the carbide component at the interface between the diamond substrate and the titanium-tungsten coating to enhance adhesion. The amount of tungsten and titanium carbides created must be sufficient to provide adhesion of the tungsten-titanium bonding layer to the diamond substrate. Typically, the heat treatment is performed at about 700°–960° C. for about 5–60 min. Heat treating at about 900° C. for about 15 min provides excellent bonding of the alloy coating to CVD diamond.

A typical heat treating atmosphere is an argon or hydrogen-argon mixture. An argon or hydrogen/argon gas mixture (5:95, $H_2$:Ar) with or without titanium as an oxygen and nitrogen getter have proven to be a satisfactory atmosphere for such heat treatment. The hydrogen in this atmosphere serves to prevent oxidation of the W, Ti and Ag.

Although the tungsten-titanium alloy bonds well to the diamond, the braze used to bond the diamond insert to the tungsten carbide tool does not readily wet the tungsten and titanium metal coating because of surface oxidation of the titanium and tungsten. As described herein, a protective overcoat on the tungsten-titanium alloy provides good adhesion to the bonding layer, protects the titanium and the diamond from oxidation, and affords compatibility with the braze.

An adherent protective layer is deposited by known methods, e.g., CVD, PVD, or plating directly onto the tungsten and titanium metal layer to form a dual-coated diamond article. The protective layer desirably covers the entire underlying metal layer so as to prevent deleterious chemical change, i.e. nitriding and oxidizing reactions, and loss of integrity due to exposure to the typical working environment. The protective layer is desirably compatible with the brazing material that is subsequently utilized to braze the resulting diamond coated article to a substrate. Preferred metals for the protective layer comprises Ag, Cu, Au, Pd, Pt, Ni and alloys thereof. Typical braze compatible alloys include the alloys of Ag and Cu and alloys of Ni and Cr. The preferred protective layer desirably consist essentially entirely of the above mentioned components. The most preferred protective layer is Ag. To achieve good compatibility with the braze, the protective layer is desirably free from the titanium and tungsten components of the underlying layer.

Achieving optimum adhesion between the protective layer and the underlying tungsten-titanium layer also involves a heat treatment, described further below. Since the titanium component of the metal layer tends to migrate into the protective layer, the heat treatment should be carried out under conditions which reduce the migration of titanium. The tungsten component of the alloy aids in this respect by controlling and reducing the activity of the titanium, slowing its diffusion into and through the protective layer. Higher levels of tungsten and lower temperatures tend to reduce titanium migration.

The same heat treatment used to bond the tungsten-titanium alloy to the CVD diamond may be utilized to bond the protective layer to the tungsten-titanium metal layer. Thus, the two layers conveniently can be heat treated at the same time by after the application of the two layers. As previously discussed, argon or hydrogen/argon gas mixture (5:95, $H_2$:Ar) with or without titanium as an oxygen and nitrogen getter have proven to be a satisfactory atmosphere for such heat treatment. The hydrogen in this atmosphere serves to prevent oxidation of the W, Ti and Ag.

Once coated with the tungsten-titanium bonding layer and the protective overcoat, this dual-coated diamond article, for example, a sheet-form diamond tool insert, may be brazed in air to a tool substrate using a standard braze and without requiring a vacuum furnace or special atmosphere. Typical standard brazes are the silver brazes which have liquidus temperatures of 600–900 degrees Centigrade. An example of such a braze is Easy-Flo 45 (a product of Lucas Mulhaupt, Inc.), an alloy of, in % by weight, 45% silver, 15% copper, 16% zinc, and 24% cadmium with a liquidus temperature of 620° C. The brazing technique employed may be induction or other techniques known in the art. The present invention results in fabrication of coated diamond inserts suitable for brazing in air. Thus, a diamond tool insert may be replaced on site, for example, in a typical industrial environment such as a machine shop, in an ambient shop atmosphere.

The following Examples are presented to enable those skilled in the art to more clearly understand and practice the present invention. These Examples should not be considered as a limitation upon the scope of the present invention, but merely as being illustrative and representative thereof.

EXAMPLE 1

A series of CVD diamond discs, dimensions 5 mm in diameter and 0.25–0.50 mm thick, were cleaned in boiling 1:1:1 HCl:$HNO_3$:HF for 4 hours followed by boiling 4:1 $H_2SO_4$:$HNO_3$. The cleaned samples were coated with about 3000 Å of a WTi alloy (90:10, by weight, W:Ti) by sputtering. A protective overcoat of silver about 10,000 Å thick was sputtered onto each alloy coated sample. The dual coated CVDD was treated from 680°–960° C. for 15–60 minutes in a 5% $H_2$/Ar environment without titanium present as a oxygen getter. The samples were then evaluated for adhesion and brazeability in two separate tests. The first test was a standard tensile pull test performed on the coated diamond substrate after heat treating to bond the coating to the diamond. This test, which measures the adhesion of the coating to the diamond, was limited to 10 Kpsi. The second test was designed to measure both the adhesion of the coating to the diamond substrate after brazing in air and the compatibility of the coating with the braze. In this test, henceforth referred to as braze-ability, an assembly of the dual coated diamond sample, an Easy-Flow 45 brazing alloy preform and Harris white braze flux, and a cemented WC substrate was heated in air at about 700° C. for about 1–5 minutes. The cooled assembly was then sheared using an Instron shear strength tester. The limit of this test was set by the strength of the braze. All samples achieved the limit of the tensile pull test of 10 Kpsi. In the shear test, all samples heat treated above 740° C. but below 960° C. to form the bond layer exceeded the 20 Kpsi goal, with good braze compatibility. Most of the shear test samples achieved about 30 Kpsi, with some of the failures occurring in the braze rather than between the coating and the diamond.

EXAMPLE 2

A series of CVD Diamond samples 5 mm in diameter and 0.25– 0.50 mm thick were coated with about 3000 Å of a WTi alloy (90:10, by weight, W:Ti), as described in Example 1. A protective NiCr layer 8000 Å thick was sputtered onto the WTi coated sample. The dual coated CVDD was treated at typically 900° C. for 15 minutes in a 5% $H_2$/Ar environment with Ti powder added to getter oxygen. The samples were then evaluated for adhesion and braze-ability as described above for example 1. Again all the samples after heat treating achieved the limit of the tensile pull test of 10 Kpsi. In the shear test, however, one of the samples exceeded the 20 Kpsi goal, the other two samples resulted in de-bonding of the CVDD from the WC substrate during cool down from the brazing temperature prior to shearing.

EXAMPLE 3

A series of CVD Diamond samples 5 mm in diameter and 0.25– 0.50 mm thick were coated with about 150–2000 Å of Ti, as described in Example 1. A protective W layer 5000 Å thick and a protective Ag layer 7500 Å thick were sputtered onto the Ti coated sample. The tri-coated CVDD was treated at typically 900° C. for 15 minutes in a 5% $H_2$/Ar environment with Ti powder added to getter oxygen. The samples were then evaluated for adhesion and braze-ability as described above for example 1. Again all the samples achieved the limit of the tensile pull test of 10 Kpsi. In the shear test, however, none of the samples with Ti<~2000 Å exceeded the 20 Kpsi goal. Samples with 2000 Å of Ti exceeded the 20 Kpsi goal with typical shears of 30 Kpsi.

The following examples are set forth as comparison examples to illustrate the unexpected and preferred features of the present invention.

EXAMPLE 4

This example illustrates the lack of adhesion that is attained by a titanium coating alone. A series of CVD Diamond samples 5 mm in diameter and 0.25–0.50 mm thick were coated with 1000 Å of Ti by sputtering, as described in Example 1. A protective Ag overcoat 5000–10,000 Å thick was sputtered onto the Ti coated sample. The dual coated CVDD was treated at typically 900° C. for 15 minutes in a 5% $H_2$/Ar environment with Ti powder added to getter oxygen. The samples were then evaluated for adhesion and braze-ability as described above for example 1. Again all the samples achieved the limit of the tensile pull test of 10 Kpsi. In the shear test, however, none of the samples exceeded the 20 Kpsi goal. In fact 7 of the 8 samples resulted in de-bonding of the CVDD from the WC substrate during cool down from the brazing temperature prior to shearing.

EXAMPLE 5

This example illustrates the lack of adhesion that is attained by a titanium coating absent any tungsten component but having a protective overcoat. A series of CVD Diamond samples 5 mm in diameter and 0.25– 0.50 mm thick were coated with 1000 Å of Ti by sputtering, as described in Example 1. A protective NiCr overcoat 5000–10,000 Å thick was sputtered onto the Ti coated sample. The dual coated CVDD was treated at typically 900° C. for 15 minutes in a 5% $H_2$/Ar environment with Ti powder added to getter oxygen. The samples were then evaluated for adhesion and braze-ability as described above for example 1. Again all the samples achieved the limit of the tensile pull test of 10 Kpsi. In the shear test, however, none of the samples exceeded the 20 Kpsi goal. In fact of all three samples resulted in de-bonding of the CVDD from the WC substrate during cool down from the brazing temperature prior to shearing.

EXAMPLE 6

This example illustrates the lack of adhesion that is attained by a titanium coating absent any tungsten component but having a protective overcoat. A series of CVD Diamond samples 5 mm in diameter and 0.25– 0.50 mm thick were coated with 1000 Å of Ti by sputtering, as described in Example 1. A protective Ag/Cu layer 5000 Å/3000 Å thick was sputtered onto the Ti coated sample. The dual coated CVDD was treated at typically 900° C. for 15 minutes in a 5% $H_2$/Ar environment with Ti powder added to getter oxygen. The samples were then evaluated for adhesion and braze-ability as described above for example 1. Again all the samples achieved the limit of the tensile pull test of 10 Kpsi. In the shear test, however, none of the samples exceeded the 20 Kpsi goal. In fact all three samples resulted in de-bonding of the CVDD from the WC substrate during cool down from the brazing temperature prior to shearing.

EXAMPLE 7

This example illustrates the lack of adhesion that is attained by a titanium/tungsten coating having a coating other than a braze compatible protective overcoat of the present invention. A series of CVD Diamond samples 5 mm in diameter and 0.25–0.50 mm thick were coated with about 3000 Å of a WTi alloy (90:10, by weight, W:Ti), as described in Example 1. A protective W layer 4500 Å thick was sputtered onto the WTi coated sample. The dual coated CVDD was treated at typically 900° C. for 15 minutes in a 5% $H_2$/Ar environment with Ti powder added to getter oxygen. The samples were then evaluated for adhesion and braze-ability as described above for example 1. Again all the samples achieved the limit of the tensile pull test of 10 Kpsi. In the shear test, however, none of the samples exceeded the 20 Kpsi goal. In fact all three samples resulted in de-bonding of the CVDD from the WC substrate during cool down from the brazing temperature prior to shearing.

EXAMPLE 8

A series of CVD diamond samples with a preferred tungsten/titanium coating but without a protective coat and not in accordance with the present invention were evaluated as a comparison example. About 5 mm in diameter size and 0.25–0.50 mm thick were coated with thickness about 0.05–1.2 µm of a 90:10 ratio of W:Ti alloy by sputtering, then evaluated for adhesion and brazability as per Example 1. None of the samples exceeded 20 Kpsi, typical adhesion strengths being about 5–10 Kpsi.

The invention described herein presents to the art novel, improved diamond tool inserts and other diamond articles suitable for brazing in air, as well as a novel method for their manufacture. The above-described diamond sheets brazed to cemented tungsten carbide or other hard substrates could be used as tool inserts, reamers, end mills, drill bits, dressers, cutting tools, and other applications known in the cutting tool art. Although the inserts described herein are polycrystalline CVD diamond sheets, other forms of diamond can be used as described to form diamond tools. For example, the diamond base for the coated insert can be natural monocrystalline diamond, sintered polycrystalline blanks (PCD) or thermally stable diamond (TSD). The invention also is not limited to cutting tool inserts. The same coatings and method are suitable to any application in which a diamond surface is to be brazed to another hard surface, particularly when low temperature air brazing is desired.

While there has been shown and described what are at present considered the preferred embodiments of the invention, it will be apparent to those skilled in the art that modifications and changes can be made therein without departing from the scope of the present invention as defined by the appended claims.

We claim:

1. A method for manufacturing a diamond article comprising the steps of:

depositing a tungsten and titanium alloy layer on a diamond substrate, said alloy layer and said diamond substrate forming an interface therebetween;

depositing a substantially non-oxidizable protective layer on said alloy layer to form a dual-coated diamond article; and heating said dual-coated diamond article at a temperature and for a time sufficient to form titanium carbide at the interface between said alloy layer and said diamond substrate to provide adhesion of said alloy layer to said diamond substrate; whereby said diamond article is brazable in air.

2. A method in accordance with claim 1 wherein said heating step is carried out as a single heat treatment performed on said dual-coated diamond article, and said temperature and time are sufficient to also enhance adhesion of said protective layer to said alloy layer.

3. A method in accordance with claim 1 wherein said heating is carried out in an atmosphere including sufficient hydrogen to prevent oxidation of said tungsten and said titanium.

4. A method in accordance with claim 1 wherein said temperature is about 700°–960° C. said time is about 5–60 min, and heat treating atmosphere is a hydrogen-argon mixture including an oxygen and nitrogen getter.

5. A method in accordance with claim 1 further comprising the step, before the depositing steps, of processing the diamond substrate to preselected dimensions.

6. A method in accordance with claim 1 further comprising the step, after the heating step, of brazing said dual-coated diamond article to a tool substrate.

\* \* \* \* \*